(12) United States Patent
Luo et al.

(10) Patent No.: US 11,114,476 B2
(45) Date of Patent: Sep. 7, 2021

(54) MANUFACTURING METHOD OF TFT ARRAY SUBSTRATE, TFT ARRAY SUBSTRATE AND DISPLAY PANEL

(71) Applicant: SHENZHEN CHINA STAR OPTOELECTRONICS TECHNOLOGY CO., LTD., Guangdong (CN)

(72) Inventors: Chuanbao Luo, Guangdong (CN); Jiangbo Yao, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 492 days.

(21) Appl. No.: 16/076,186

(22) PCT Filed: Jun. 11, 2018

(86) PCT No.: PCT/CN2018/090650
§ 371 (c)(1),
(2) Date: Aug. 7, 2018

(87) PCT Pub. No.: WO2019/196191
PCT Pub. Date: Oct. 17, 2019

(65) Prior Publication Data
US 2021/0098511 A1    Apr. 1, 2021

(30) Foreign Application Priority Data

Apr. 13, 2018  (CN) .......................... 201810333074.5

(51) Int. Cl.
*H01L 27/12* (2006.01)
*G02F 1/1362* (2006.01)
(Continued)

(52) U.S. Cl.
CPC ........ *H01L 27/1288* (2013.01); *G02F 1/1368* (2013.01); *G02F 1/136222* (2021.01);
(Continued)

(58) Field of Classification Search
CPC ............. H01L 29/786; H01L 29/78669; H01L 29/66765; H01L 27/1288; H01L 27/1255;
(Continued)

(56) References Cited

U.S. PATENT DOCUMENTS 10,910,498 B2 *   2/2021  Cao .................... H01L 29/66969
2003/0232456 A1  12/2003  Yang et al.
(Continued)

FOREIGN PATENT DOCUMENTS

CN         101097928 A      1/2008
CN         101325181 A     12/2008
(Continued)

OTHER PUBLICATIONS

Chinese Office Action issued in Chinese Patent Application No. 201810333074.5, dated Mar. 3, 2020, pp. 1-19, The State Intellectual Property Office of P.R.C., Beijing, China.

*Primary Examiner* — Galina G Yushina
(74) *Attorney, Agent, or Firm* — Leong C. Lei

(57) ABSTRACT

A manufacturing method of a TFT array substrate is provided, comprising: depositing and forming a gate and a gate scanning line; depositing sequentially a gate insulating layer, an active layer and a second metal layer; depositing and forming a first photoresist layer and a second photoresist layer on the second metal layer; first photoresist layer comprising a first-stage photoresist layer, second-stage photoresist layer and third-stage photoresist layer with increasing thickness, the first-stage photoresist layer being in the middle of the first photoresist layer and a channel being formed; ashing to remove first-stage photoresist layer, form- (Continued)

ing a source and a drain by etching; and ashing to remove the second-stage photoresist layer, and then depositing a passivation layer as a whole; stripping third-stage photoresist layer and second photoresist layer, depositing and forming a pixel electrode and a common electrode.

19 Claims, 5 Drawing Sheets

(51) Int. Cl.
*G02F 1/1368* (2006.01)
*H01L 29/66* (2006.01)
*H01L 29/786* (2006.01)

(52) U.S. Cl.
CPC ...... *G02F 1/136295* (2021.01); *H01L 27/124* (2013.01); *H01L 27/127* (2013.01); *H01L 27/1222* (2013.01); *H01L 27/1255* (2013.01); *H01L 29/66765* (2013.01); *H01L 29/78669* (2013.01); *G02F 2202/103* (2013.01)

(58) Field of Classification Search
CPC . H01L 27/1222; H01L 27/127; H01L 27/124; G02F 1/136295; G02F 1/136222; G02F 1/1368

See application file for complete search history.

(56) References Cited

U.S. PATENT DOCUMENTS

| | | | |
|---|---|---|---|
| 2008/0018850 A1* | 1/2008 | Shih | H01L 27/124 349/152 |
| 2014/0117371 A1* | 5/2014 | Ma | H01L 29/6675 257/72 |
| 2016/0005870 A1* | 1/2016 | Huang | H01L 21/02554 257/43 |
| 2016/0013210 A1* | 1/2016 | Li | H01L 27/1262 257/72 |

FOREIGN PATENT DOCUMENTS

| | | |
|---|---|---|
| CN | 101350330 A | 1/2009 |
| CN | 101556935 A | 10/2009 |

\* cited by examiner

MANUFACTURING METHOD OF TFT ARRAY SUBSTRATE, TFT ARRAY SUBSTRATE AND DISPLAY PANEL

RELATED APPLICATION

The present application is a National Phase of International Application Number PCT/CN2018/090650, filed Jun. 11, 2018, and claims priority to Chinese Patent Application No. 201810333074.5, entitled "manufacturing method of TFT array substrate, TFT array substrate and display panel", filed on Apr. 13, 2018, the disclosure of which is incorporated herein by reference in its entirety.

FIELD OF THE INVENTION

The present disclosure relates to a flexible display field, in particular to a TFT array substrate and a manufacturing method thereof, and a display panel.

BACKGROUND OF THE INVENTION

Currently, TFT-LCD (Thin Film Transistor Liquid Crystal Display) has become one of mainstream displays. Each liquid crystal pixel on TFT-LCD is driven by a TFT (Thin Film Transistor) integrated behind pixel, so that the screen information can be displayed at high speed, high brightness and high contrast. The manufacturing of TFT-LCD can be roughly divided into three processes including TFT array process, liquid crystal unit process and liquid crystal module process, in which the TFT array process has an important influence on the display performance of a liquid crystal panel, especially on the manufacturing cost of a panel.

In the TFT array process of manufacturing a TFT array substrate, multiple photolithography procedures in which the mask is used are indispensable, such as for a semiconductor integrated circuit board. The process of manufacturing TFT array substrate has experienced the development process from 7-mask process to the present 5- or 4-mask process, and the 5- or 4-mask process is still the mainstream technology for manufacturing a TFT array substrate nowadays. An increasingly maturing 4-mask process is formed by merging the photolithography of an active layer and a drain into one mask using grayscale lithography technology on the basis of the original 5-mask process. However, the requirement for the productivity efficiency of a TFT array substrate is increasingly strict with increasing demand for a TFT array substrate in the display panel market. Therefore, it is necessary to develop a manufacturing process of a TFT array substrate, which can significantly simplify the process flow and greatly improve the productivity and utilization of equipments.

SUMMARY OF THE INVENTION

In light of this, a manufacturing method of a TFT array substrate is provided by the implementations of the present disclosure. The manufacturing method adopts 3-mask process, which can significantly simplify the process flow and greatly improve the productivity and utilization of equipments.

In the first aspect, the implementations of the present disclosure provides a manufacturing method of a TFT array substrate comprising:

providing a rigid substrate, depositing a first metal layer on the rigid substrate, and patterning the first metal layer to form a gate electrode and a gate scanning line;

depositing sequentially a gate insulating layer, an active layer and a second metal layer on the gate electrode and the gate scanning line;

coating photoresist on the second metal layer and patterning the photoresist to form a first photoresist layer and a second photoresist layer; wherein the first photoresist layer comprises a first-stage photoresist layer, a second-stage photoresist layer and a third-stage photoresist layer; the thickness of the second-stage photoresist layer is larger than that of the first-stage photoresist layer, and the thickness of the third-stage photoresist layer is larger than that of the second-stage photoresist layer; the first-stage photoresist layer is disposed in the middle of the first photoresist layer and a channel is formed; and the thickness of the second photoresist layer is larger than that of the second-stage photoresist layer;

etching a region of the second metal layer, a region of the active layer and a region of the gate insulating layer, which are outside the channel and uncovered by the first photoresist layer and the second photoresist layer to expose the rigid substrate;

performing ashing treatment on the first photoresist layer and the second photoresist layer to remove the first-stage photoresist layer, and forming a source electrode and a drain electrode by etching;

performing ashing treatment on the second-stage photoresist layer, the third-stage photoresist layer and the second photoresist layer to remove the second-stage photoresist layer, and then depositing a passivation layer as a whole;

stripping the third-stage photoresist layer and the second photoresist layer, and depositing a transparent conductive layer and patterning the transparent conductive layer to form a pixel electrode and a common electrode.

Optionally, the active layer comprises a first amorphous silicon film and a second amorphous silicon film sequentially stacked on the gate insulating layer, and the first amorphous silicon film is disposed between the gate insulating layer and the second amorphous silicon film.

Optionally, the material of the first amorphous silicon film comprises amorphous silicon and the material of the second amorphous silicon film comprises impurity ion-doped amorphous silicon.

Optionally, the process of forming a source and a drain by etching comprises: etching the first metal layer covered by the first-stage photoresist layer and etching the second amorphous silicon film.

Optionally, after etching a region of the second metal layer, a region of the active layer and a region of the gate insulating layer, which are outside the channel and uncovered by the first photoresist layer and the second photoresist layer, a data line layer is formed from the second metal layer covered by the second photoresist layer.

Optionally, the gate scanning line and the data line layer is bridged through the common electrode.

Optionally, the material of the transparent conductive layer comprises at least one of indium tin oxide (ITO), indium oxide zinc (IZO), aluminum zinc oxide (AZO) and indium gallium zinc oxide (IGZO).

Optionally, the material of the passivation layer comprises at least one of silicon oxide ($SiO_x$) and silicon nitride ($SiN_x$).

The manufacturing method of a TFT array substrate in the first aspect of the present disclosure adopts 3-mask process, and it significantly simplifies the process flow and greatly improves the productivity and utilization of equipments, reduces production cost and can be used for large-scale industrial production. The TFT array substrate prepared by the manufacturing method described herein has excellent performance and stable structure.

In the second aspect, the present disclosure provides a TFT array substrate prepared by the manufacturing method as described in the first aspect of the present disclosure. The TFT array substrate comprises a rigid substrate, a gate electrode and a gate scanning line stacked on the rigid substrate; and a gate insulating layer, an active layer, a source electrode, a drain electrode, a data line layer, a passivation layer, a pixel electrode and a common electrode stacked sequentially on the gate electrode and the gate scanning line. One side of the drain electrode disclosed herein is covered with the pixel electrode; the gate insulating layer and the active layer are disposed between the gate scanning line and the data line layer; the gate scanning line and the data line layer are respectively connected with the common electrode. The conduction between the gate scanning line and the data line layer can be achieved conveniently by the common electrode acting as a bridge between them in the TFT array substrate of the second aspect in the present disclosure, which is beneficial to the subsequent peripheral layout and wiring.

In the third aspect, the present disclosure further provides a display panel comprising a TFT array substrate prepared by the manufacturing method as described in the first aspect of the present disclosure. The display panel further comprises a color film substrate, a liquid crystal layer, a backlight module, and the like. The advantages of the present disclosure will be partly explained in the following description, some of the advantages are obvious according to the description, or can be known by the implementation of the implementations of the present disclosure.

DETAILED DESCRIPTION OF THE INVENTION

The following are preferred implementations of the present disclosure, and it should be noted that those skilled in the art can make some improvements and embellishments without departing from the principles of the implementations of the present disclosure, and those improvements and embellishments shall be within the protection scope of the implementations of the present disclosure.

The terms "comprising" and "having", and any variations thereof appearing in the description, the claims, and the drawings of the application are intended to cover non-exclusive inclusions. For example, a process, method, system, product, or device that comprises a series of steps or units is not limited to the listed steps or units, but optionally further comprises unlisted steps or units, or, optionally further comprises other steps or units inherent to the process, method, system, product, or device. Moreover, the terms "first", "second", "third", etc. are used to distinguish different objects, and are not intended to describe a particular stage.

Figure 1:
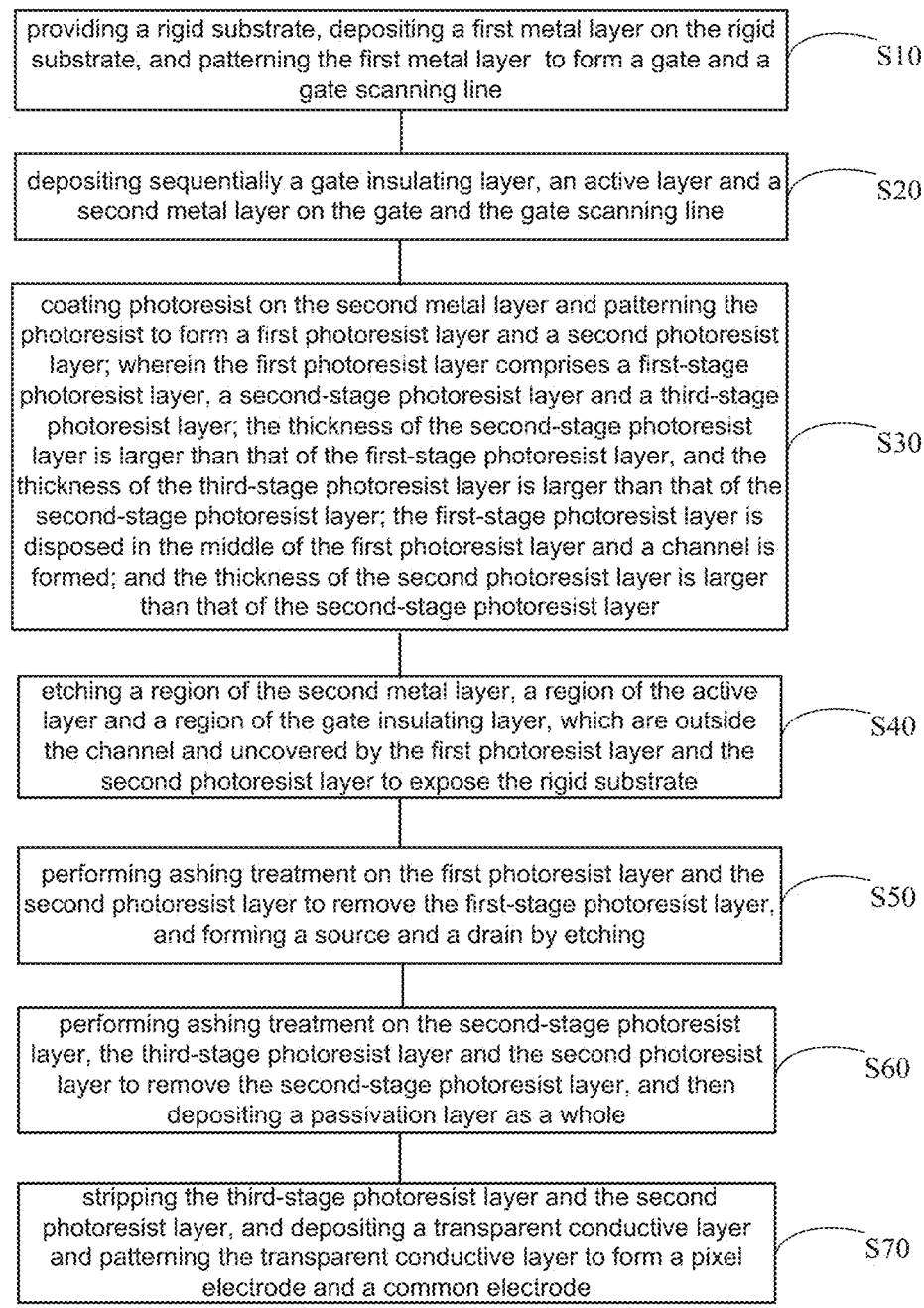
FIG. 1 is a process flow diagram illustrating a manufacturing method of a TFT array substrate provided by an implementation of the present disclosure.

See FIG. 1. The present disclosure provides a manufacturing method of a TFT array substrate comprising:

S10: providing a rigid substrate, depositing a first metal layer on the rigid substrate, and patterning the first metal layer to form a gate electrode and a gate scanning line;

S20: depositing sequentially a gate insulating layer, an active layer and a second metal layer on the gate electrode and the gate scanning line;

S30: coating photoresist on the second metal layer and patterning the photoresist to form a first photoresist layer and a second photoresist layer; wherein the first photoresist layer comprises a first-stage photoresist layer, a second-stage photoresist layer and a third-stage photoresist layer; the thickness of the second-stage photoresist layer is larger than that of the first-stage photoresist layer, and the thickness of the third-stage photoresist layer is larger than that of the second-stage photoresist layer; the first-stage photoresist layer is disposed in the middle of the first photoresist layer and a channel is formed; and the thickness of the second photoresist layer is larger than that of the second-stage photoresist layer;

S40: etching a region of the second metal layer, a region of the active layer and a region of the gate insulating layer, which are outside the channel and uncovered by the first photoresist layer and the second photoresist layer to expose the rigid substrate;

S50: performing ashing treatment on the first photoresist layer and the second photoresist layer to remove the first-stage photoresist layer, and forming a source electrode and a drain electrode by etching;

S60: performing ashing treatment on first photoresist layer and the second photoresist layer to remove the second-stage photoresist layer, and then depositing a passivation layer as a whole;

S70: stripping the third-stage photoresist layer and the second photoresist layer, and depositing a transparent conductive layer and patterning the transparent conductive layer to form a pixel electrode and a common electrode.

Figure 2:
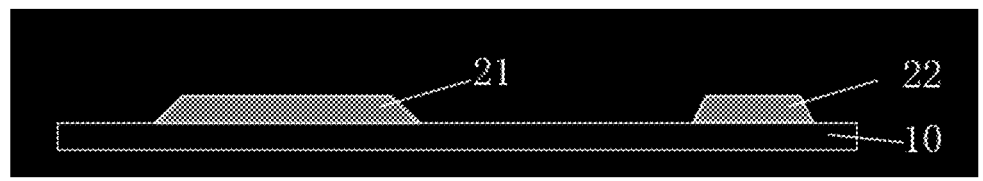
FIG. 2 is a schematic cross-sectional view illustrating the step S10 in a manufacturing method of a TFT array substrate provided by an implementation of the present disclosure.

Specifically, as shown in FIG. 2, at S10, rigid substrate 10 is provided, a first metal layer (M1) (not drawn) is deposited on the rigid substrate using physical vapor deposition (PVD) and patterned to form gate electrode 21 and gate scanning line 22 by operations of coating, exposure, developing, etching, stripping, and the like using a first mask process. The rigid substrate can comprise an active area (AA) region and non-active area (non-AA) region, and the gate electrode is located in AA region and the gate scanning line is in non-AA region. In the method of the implementation, the material of the first metal layer comprises at least one of copper (Cu), aluminum (Al), neodymium (Nd), chromium (Cr), molybdenum (Mo), titanium (Ti) and silver (Ag). Specifically, the material of the first metal layer can be copper or silver, or the like. The material of the first metal layer can also be copper-aluminum alloy, copper-molybdenum alloy, copper-titanium alloy or silver-molybdenum alloy, or the like. The first metal layer has low electrical resistance, good electrical conductivity, and has characteristics such as toughness and bending resistance. Correspondingly, gate electrode 21 and gate scanning line 22 have high electrical conductivity. Optionally, the section of pattern formed by etching (such as gate electrode 21 and gate scanning line 22) is a slop surface (such as a trapezoidal shape) so as to reduce the incidence of cross-break, and it can effectively avoid the disconnection or break of other film layers deposited subsequently. Optionally, the method for depositing the first metal layer further comprises magnetron sputtering, chemical vapor deposition (CVD), etc. The etching comprises wet etching or dry etching. Processes of cleaning, detecting, etc, can be included in S10 without limitation.

In the implementation, the thickness and shape of gate 21 or gate scanning line 22 can be defined according to product and process requirements. Preferably, the surface of gate electrode 21 and/or gate scanning line 22 can be provided with a layer resisting oxidation and corrosion to improve the practical performance of the product and prolong the service life of the product. Further, after the first metal layer is patterned, a first electrode for storage of capacitance is also formed in addition to the formation of a gate and a gate scanning line.

Figure 3:
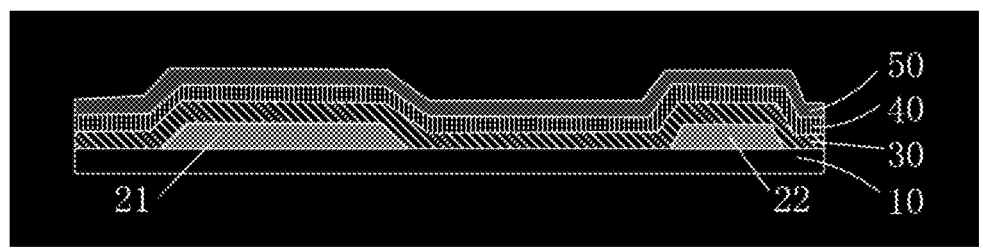
FIG. 3 is a schematic cross-sectional view illustrating the step S20 in a manufacturing method of a TFT array substrate provided by an implementation of the present disclosure.

As shown in FIG. 3, at S20, gate insulating layer 30 is deposited and formed on the entire surface of rigid substrate10 provided with gate electrode 21 and gate scanning line 22 obtained at above S10; gate insulating layer 30 completely covers gate electrode 21 and gate scanning line 22 and extends to the entire surface of rigid substrate 10; then active layer 40 and second metal layer (M2) are deposited on gate insulating layer 30. Optionally, the deposition method comprises at least one of magnetron sputtering, chemical vapor deposition and physical vapor deposition. Preferably, gate insulating layer 30 and active layer 40 are continuously deposited on rigid substrate 10 provided with gate electrode 21 and gate scanning line 22 by chemical vapor deposition; and second metal layer 50 is deposited by physical vapor deposition. In the implementation, the material of gate insulating layer 30 comprises at least one of silicon oxide ($SiO_x$) and silicon nitride ($SiN_x$). The silicon oxide ($SiO_x$) comprises silicon monoxide (SiO), silicon dioxide ($SiO_2$) or silicon oxide with other valence states. The material of gate insulating layer 30 can also be prepared from other inorganic materials. The gate insulating layer 30 prepared from $SiO_x$, $SiN_X$ and other inorganic materials can play a role in protecting and keeping gate electrode 21 or gate scanning line 22 being insulated. The material of the second metal layer 50 comprises at least one of copper, aluminum, neodymium, chromium, molybdenum, titanium and silver. Optionally, the material of the second metal layer 50 can be copper, silver, or titanium, or the like. The material of the second metal layer 50 can also be copper-aluminum alloy, aluminum-neodymium alloy copper-molybdenum alloy, copper-titanium alloy or silver-molybdenum alloy, or the like. The material of the second metal layer 50 and the first metal layer may be the same or different. By continuously and sequentially depositing gate insulating layer 30, active layer 40, and second metal layer 50, a good interlayer contact can be formed among the above three layers, thus reducing interface state density and improving product quality.

In the implementation, active layer 40 comprises a first amorphous silicon film and a second amorphous silicon film sequentially stacked on gate insulating layer 30, and the first amorphous silicon film is disposed between the gate insulating layer and the second amorphous silicon film. The material of the first amorphous silicon film comprises amorphous silicon (a-Si); and the material of the second amorphous silicon film comprises impurity ion-doped amorphous silicon (n+a-Si). Further, optionally, the amorphous silicon comprises hydrogenated amorphous silicon; the impurity ion-doped amorphous silicon comprises phosphorus-doped amorphous silicon. In the implementation, the first amorphous silicon film serves as a semiconductor layer, the second amorphous silicon film can serve as an ohmic contact layer to reduce the contact resistance between the source and/or the drain and the first amorphous silicon film, and to improve product performance.

Figure 4:
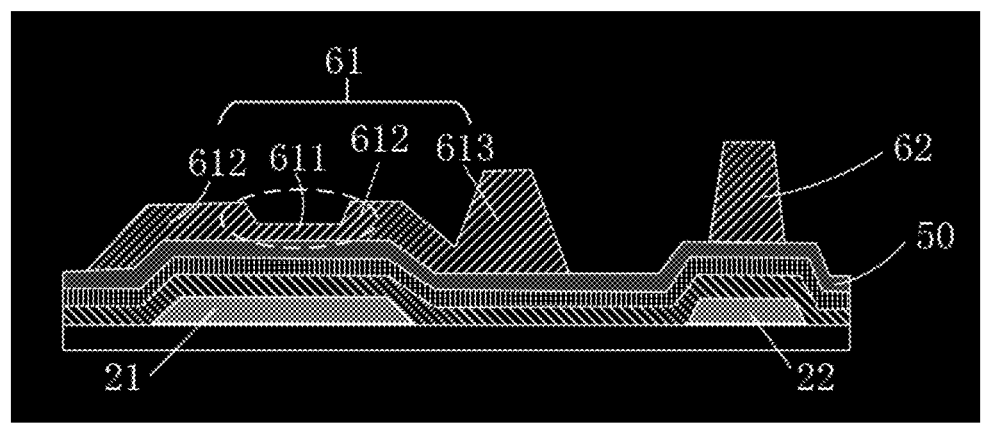
FIG. 4 is a schematic cross-sectional view illustrating the step S30 in a manufacturing method of a TFT array substrate provided by an implementation of the present disclosure.

As shown in FIG. 4, at S30, photoresist is deposited on the rigid substrate provided with the second metal layer obtained at S20 using a second mask process and patterned to form first photoresist layer 61 and second photoresist layer 62 by coating, exposal, development, etching, and stripping processes using a mask in three grayscales. First photoresist layer 61 has three or more thickness variations and comprises first-stage photoresist layer 611, second-stage photoresist layer 612 and third-stage photoresist layer 613. The thickness of first-stage photoresist layer 611, second-stage photoresist layer 612 and third-stage photoresist layer 613 disclosed herein increases sequentially, that is, the thickness of second-stage photoresist layer 612 is larger than that of first-stage photoresist layer 611, and the thickness of third-stage photoresist layer 613 is larger than that of second-stage photoresist layer 612. First-stage photoresist layer 611 is disposed in the middle of first photoresist layer 61 and a concave-like channel is formed. In the implementation, first-stage photoresist layer 611 is disposed in the middle of second-stage photoresist layer 612; first-stage photoresist layer 611 in the middle portion has a minimum thickness, thereby forming a groove structure and forming a channel (see the dotted circle in FIG. 4). Optionally, first-stage photoresist layer 611 can be disposed between second-stage photoresist layer 612 and third-stage photoresist layer 613. In the implementation, the thickness of second photoresist layer 62 spaced from first photoresist layer 61 is larger than that of second-stage photoresist layer 612. Optionally, the thickness of second photoresist layer is equal to the thickness of the third-stage photoresist layer. Second photoresist layer 62 can be disposed on gate scanning line 22, and stacked on the surface of second metal layer 50.

Figure 5:
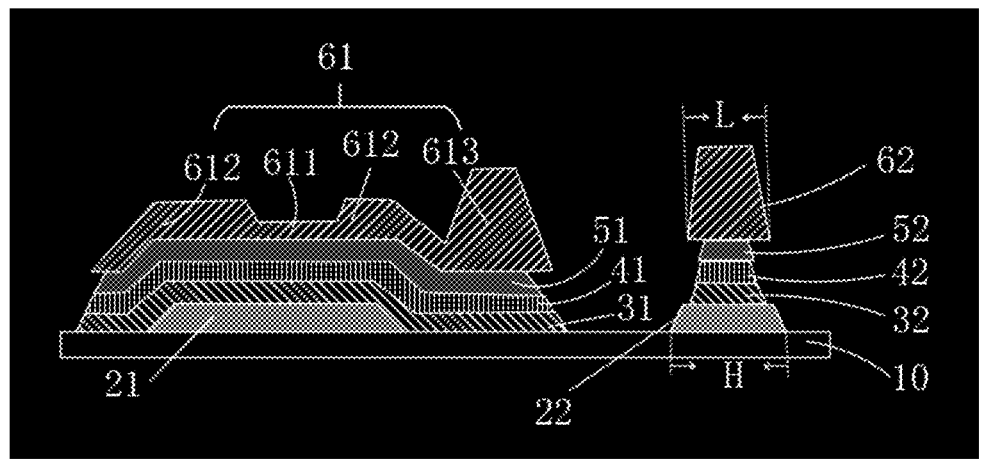
FIG. 5 is a schematic cross-sectional view illustrating the step S40 in a manufacturing method of a TFT array substrate provided by an implementation of the present disclosure.

As shown in FIG. 5, at S40, a further etching is performed on a region of the rigid substrate provided with first photoresist layer 61 and second photoresist layer 62, where the region is uncovered by first photoresist layer 61 and second photoresist layer 62. The process of the further etching comprises etching the region of second metal layer 50 which is not covered by first photoresist layer 61 and second photoresist layer 62, and then sequentially etching the exposed active layer 40 and gate insulating layer 30 below second metal layer 50 to expose rigid substrate 10. First photoresist layer 61 disclosed herein comprises first-stage photoresist layer 611, second-stage photoresist layer 612 and third-stage photoresist layer 613. The etched second metal layer 50 comprises electrode layer 51 and data line layer 52. The etched active layer 40 comprises first active layer 41 and second active layer 42. The etched gate insulating layer 30 comprises first gate insulating layer 31 and second gate insulating layer 32. Optionally, in the implementation, a region of second metal layer 50 (see FIG. 4) that is uncovered by photoresist material (including first photoresist layer 61 and second photoresist layer 62) is etched by wet etching process using wet etching reagent; and the exposed active layer 40 and gate insulating layer 30 are etched by dry etching (see FIG. 4). The wet etching process has the advantages of good selectivity, good repeatability, low cost, and high production efficiency. The dry etching process has good anisotropy and can transfer photolithography patterns with high fidelity. In the implementation, since the wet etching reagent partially penetrates during the etching process of second metal layer 50 by wet etching process, the cross-sectional width (parallel to the direction of rigid substrate 10) of the etched electrode layer 51 is smaller than that of first photoresist layer 61; the cross-sectional width of data line layer 52 is smaller than that of second photoresist layer 62.

Figure 6:
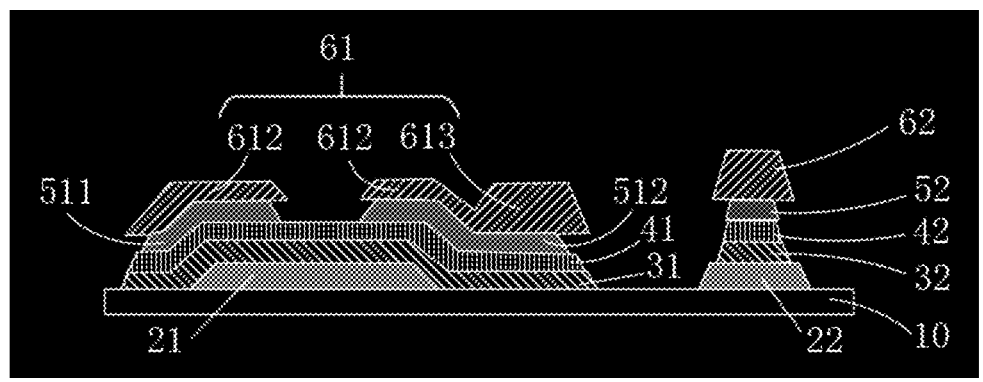
FIG. 6 is a part of a schematic view illustrating the step S50 in a manufacturing method of a TFT array substrate provided by an implementation of the present disclosure.
Figure 7:
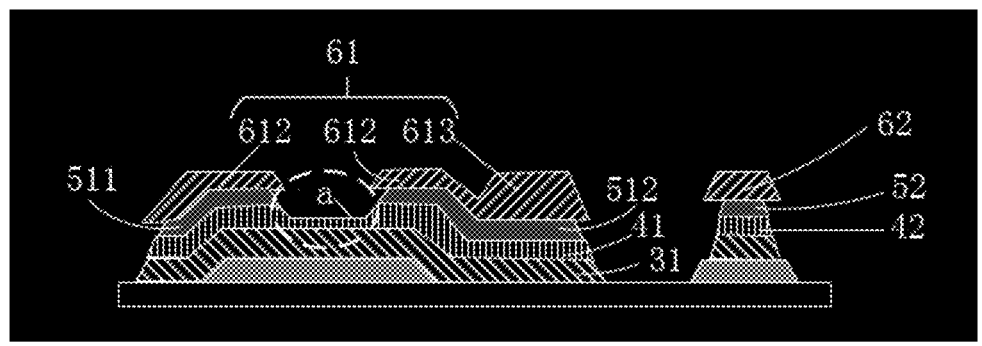
FIG. 7 is another part of a schematic view illustrating the step S50 in a manufacturing method of a TFT array substrate provided by an implementation of the present disclosure.

Referring to FIG. 5 and FIG. 6 together, at S50, rigid substrate 10 provided with first photoresist layer 61 and second photoresist layer 62 is ashed to remove first-stage photoresist layer 611; wherein both first photoresist layer 61 and second photoresist layer 62 are reduced by the thickness of first-stage photoresist layer 611; the exposed electrode layer 51 is then etched by wet etching process to expose first active layer 41; and source 511 and drain 512 are obtained. Referring to FIG. 7, first active layer 41 is further partially etched by dry etching process to form a conductive channel a (as shown in the dotted circle in FIG. 7). First active layer 41 comprises a first amorphous silicon film and a second amorphous silicon film sequentially stacked on first gate insulating layer 31. The first amorphous silicon film and the second amorphous silicon film have been described in above S20, and are not described in this implementation. The partial etching refers to etching away the second amorphous silicon film of first active layer 41 in the conductive channel a, and retaining the first amorphous silicon film of first active layer 41. A region of first active layer 41, which is in contact with source 511 and drain 512, also remains the second amorphous silicon film. Therefore, an ohmic contact can be formed between source 511, drain 512 and first active layer 41 to improve the performance of the final product.

In this implementation, after first photoresist layer 61 is removed away the first-stage photoresist layer, second-stage photoresist layer 612 and third-stage photoresist layer 613 are left. The second-stage photoresist layer 612 disclosed herein is formed into two parts due to the first-stage photoresist layer disposed in the middle portion being ashed. Since the partial ashing is performed on the photoresist material disposed on the entire surface of the rigid substrate, all of the second-stage photoresist layer 612, third-stage photoresist layer 613, and second photoresist layer 62 are uniformly reduced by the thickness of the first-stage photoresist layer that is ashed in the ashing process; and the original first-stage photoresist layer is also completely removed by subtracting its own thickness and electrode layer 51 below it is exposed. In this implementation, the first photoresist layer and the second photoresist layer are patterned by photoresist material. The photoresist material comprises organic photoresist material. Specifically, the photoresist material comprises a resin, a sensitizer, and a solvent. The photoresist material may further comprise other materials without limitation.

Figure 8:
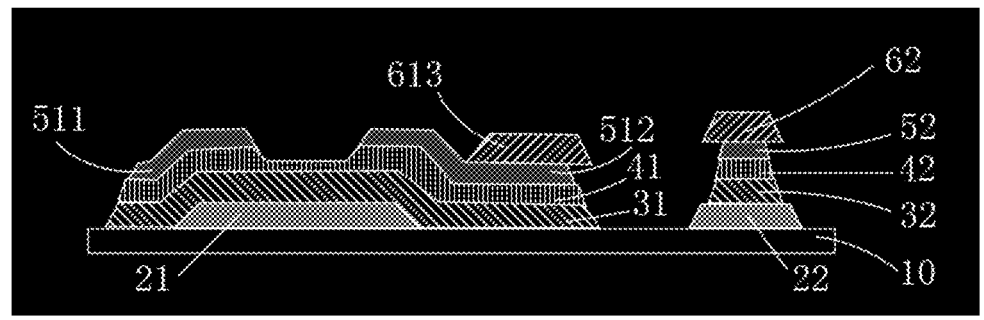
FIG. 8 is a part of a schematic view illustrating the step S60 in a manufacturing method of a TFT array substrate provided by an implementation of the present disclosure.
Figure 9:
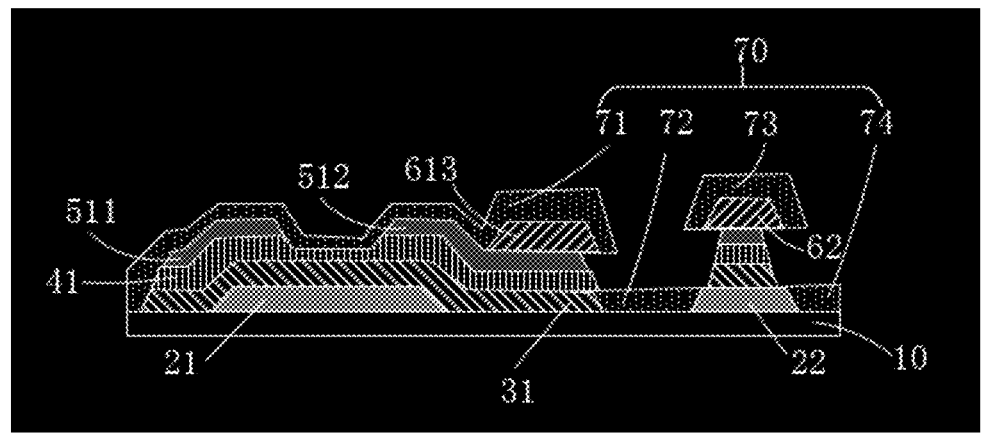
FIG. 9 is another part of a schematic view illustrating the step S60 in a manufacturing method of a TFT array substrate provided by an implementation of the present disclosure.

Since the remaining second-stage photoresist layer 612, third-stage photoresist layer 613 and second photoresist layer 62 on the surface of rigid substrate 10 provided with source 511 and drain 512 are simultaneously reduced by the thickness of first-stage photoresist layer in the above step S50, the above second-stage photoresist layer 612, third-stage photoresist layer 613 and second photoresist layer 62 are further ashed at S60 to remove second-stage photoresist layer 612; and third-stage photoresist layer 613 and second photoresist layer 62 are simultaneously reduced by the thickness of second-stage photoresist layer 612 again, as shown in FIG. 8. The remaining third-stage photoresist layer 613 is partially covered on the surface of drain 512 although its thickness is reduced again; second photoresist layer 62 still covers the surface of data line layer 52 after the ashing process because its thickness is greater than that of second-stage photoresist layer 612. In this step, as shown in FIG. 9, the depositing a passivation layer as a whole comprises: continuing depositing on one side surface of the rigid substrate with various layers of structure has been deposited (including the gate insulating layer, the active layer, etc.) and forming passivation layer 70. Since the surface of rigid substrate 10 after the above steps S10-S50 is not flat and there is a certain structural difference, it can be seen from the cross-sectional schematic view shown in FIG. 9 that passivation layer 70 comprises four portions, which are first passivation layer 71, second passivation layer 72, and third passivation layer 73 and fourth passivation layer 74, respectively. The region covered by first passivation layer 71 comprises source 511, drain 512, third-stage photoresist layer 61 and a partially exposed first active layer 41; and one side of an exposed first gate insulating layer 31, the first active layer 41 and source 511. In the implementation, the drain may be partially covered with the third-stage photoresist layer, or may be entirely covered with the third-stage photoresist layer when the surface of the drain is partially covered with the third-stage photoresist layer, the region of the surface of the drain uncovered by the third-stage photoresist layer may be directly covered with a passivation layer (such as the first passivation layer). Second passivation layer 72 and fourth passivation layer 74 cover the surface of the exposed rigid substrate 10, which is on both sides of gate scanning line 22. Third passivation layer 73 covers the surface of second photoresist layer 62. The material of the passivation layer comprises at least one of silicon nitride ($SiN_x$), silicon monoxide (SiO) and silicon dioxide ($SiO_2$). The passivation layer can play a role in protecting a thin film transistor, a data line layer and a gate scanning line, and has a certain resistance to oxygen and water vapor, and has an insulating effect.

Figure 10:
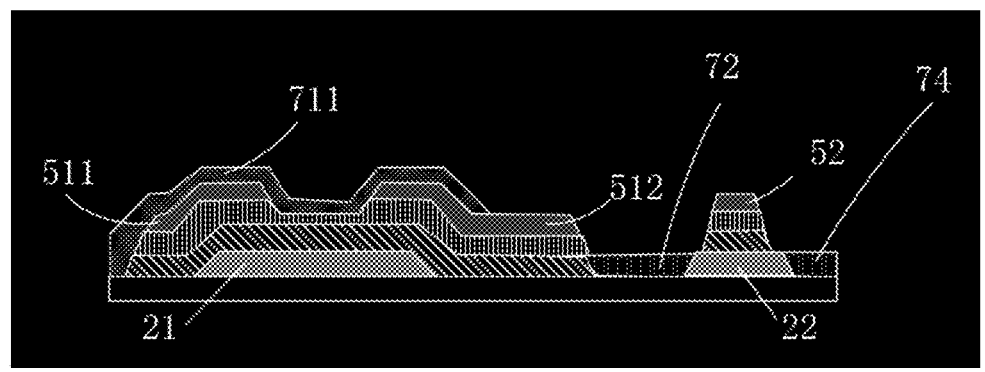
FIG. 10 is a part of a schematic view illustrating the step S70 in a manufacturing method of a TFT array substrate provided by an implementation of the present disclosure.

At S70, the remaining third-stage photoresist layer 613 and second photoresist layer 62 are stripped; when third-stage photoresist layer 613 and second photoresist layer 62 are stripped, a portion of the first passivation layer covered on the third-stage photoresist layer, the third passivation layer covered on the second photoresist layer are removed together as shown in FIG. 10; original first passivation 71

Figure 11:
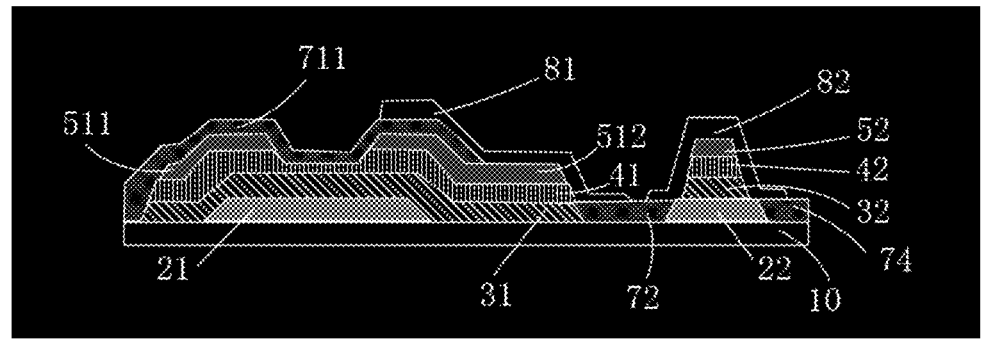
FIG. 11 is another part of a schematic view illustrating the step S70 in a manufacturing method of a TFT array substrate provided by an implementation of the present disclosure.

(see FIG. 9) becomes a new passivation layer 711, and a portion of drain 512 is partially exposed. After cleaning and drying, the transparent conductive material is then physically vapor deposited to form a transparent conductive layer, and the transparent conductive layer is patterned to form pixel electrode 81 and common electrode 82 as seen in FIG. 11 using a third mask process by coating, exposal, development, etching, and stripping processes. There is a direct contact connection region between pixel electrode 81 and drain 512, and one end of drain 512 is covered with the pixel electrode; compared with the case where the pixel electrode is connected to the drain through via-holes, the arrangement can fundamentally avoid the problem of disconnection of the pixel electrode, and is beneficial to improve the yield of the product while simplifying the process. The drain is exposed by stripping the third-stage photoresist layer, thereby facilitating the deposition and preparation of the transparent conductive layer. The pixel electrode 81 extends until passivation layer 711 and second passivation layer 72 are partially covered while covering the exposed drain 512; and the pixel electrode also play a role in protecting drain 512 and active layer 41, or the like, and can prevent the erosion of oxygen or water vapor in the air. Data line layer 52, second active layer 42 and second gate insulating layer 31 are covered by common electrode 82. When the cross-sectional width of gate scanning line 22 is larger than the width of second gate insulating layer 31, and the gate scanning line 22 is partially exposed, common electrode 82 can also extend and cover the exposed gate scanning line 22, and a bridging between gate scanning line 22 and data line layer 52 can be achieved, which is beneficial to the line layout of the subsequent display panel. Referring to FIG. 5, it is more convenient to realize the connection between the gate scanning line and the common electrode in the subsequent etching process by making the cross-sectional width L of the second photoresist layer smaller than the cross-sectional width H of the gate scanning line. Common electrode 82 can also prevent oxidation of metal electrodes (such as data line layer 52, gate scanning line 22, etc.), which are directly exposed to the atmosphere, and have a certain protective effect. In the implementation, second gate insulating layer 32 and second active layer 42 are disposed between gate scanning line 22 and data line layer 52.

Cleaning or annealing process is also included in S70 without limitation. The material of the transparent conductive layer comprises at least one of indium tin oxide, indium oxide zinc, aluminum zinc oxide and indium gallium zinc oxide. Optionally, the depositing method further comprises magnetron sputtering, chemical vapor deposition, etc.

In the implementation, the transparent conductive layer covering the outer side may also serve as a second electrode for storage of capacitance, and constitutes an upper and lower electrode for storage of capacitance together with the first electrode formed by patterning the first metal layer a passivation layer can be disposed between the first electrode and second electrode.

Cleaning, annealing or detecting operation may be included in the manufacturing method of the TFT array substrate without limitation, and specific experimental parameters during the process of S10-S70 are not excessively limited in the implementation. A total of three mask processes were used during the process of S10-S70, which greatly simplifies the process flow, drastically improves the productivity and utilization of equipments, and reduces unit cost. Moreover, the manufacturing method of the implementation has a simple process and can realize large-scale industrial production.

Another implementation further provides a manufacturing method of a TFT array substrate comprising:

S210: providing a rigid substrate, depositing a first metal layer on the rigid substrate, and patterning the first metal layer to form a gate electrode and a gate scanning line;

S220: depositing sequentially a gate insulating layer, an active layer and a second metal layer on the gate electrode and the gate scanning line;

S230: coating photoresist on the second metal layer and patterning the photoresist to form a first photoresist layer and a second photoresist layer; wherein the first photoresist layer comprises a first-stage photoresist layer, a second-stage photoresist layer and a third-stage photoresist layer; the thickness of the second-stage photoresist layer is larger than that of the first-stage photoresist layer, and the thickness of the third-stage photoresist layer is larger than that of the second-stage photoresist layer; the first-stage photoresist layer is disposed in the middle of the first photoresist layer and a channel is formed; and the thickness of the second photoresist layer is larger than that of the second-stage photoresist layer;

S240: etching a region of the second metal layer that is outside the channel and uncovered by the first photoresist layer and the second photoresist layer to expose the active layer, and performing ashing treatment on the first photoresist layer and the second photoresist layer to remove the first-stage photoresist layer;

S250: etching a region of the exposed active layer and a region of the gate insulating layer, which are outside the channel to expose the rigid substrate, and forming a source electrode and a drain electrode by etching;

S260: performing ashing treatment on the first photoresist layer and the second photoresist layer to remove the second-stage photoresist layer, and then depositing a passivation layer as a whole;

S270: stripping the third-stage photoresist layer and the second photoresist layer, and depositing a transparent conductive layer and patterning the transparent conductive layer to form a pixel electrode and a common electrode.

Figure 12:
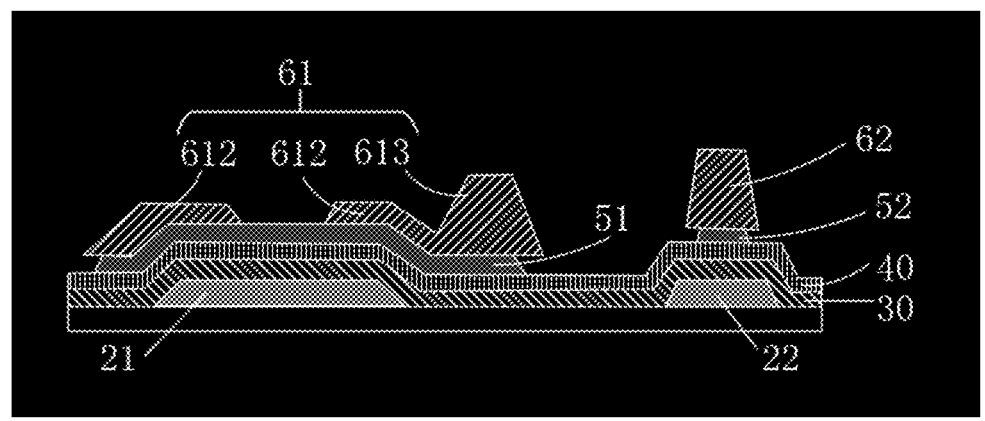
FIG. 12 is a partial schematic view illustrating the step S240 in a manufacturing method of a TFT array substrate provided by another implementation of the present disclosure.

The difference between this implementation and the previous implementation is that there is a difference in the stage of operations of performing the ashing treatment on the first photoresist layer and the second photoresist layer to remove the first-stage photoresist layer for the first time at S240 in this implementation. In this implementation, the operation of performing ashing treatment on the first photoresist and the second photoresist is after the operation of etching a region of the second metal layer that is outside the channel and uncovered by the first photoresist layer and the second photoresist layer. As shown in FIG. 12, after etching a region of the second metal layer that is outside the channel and uncovered by the first photoresist layer and the second photoresist layer, an ashing treatment is then performed on the first photoresist layer and the second photoresist layer to remove the first-stage photoresist layer. Next, a region of the exposed active layer 40 and a region of the exposed gate insulating layer 30 that are outside the channel are etched, and the exposed second metal layer in the channel (specifically, the electrode layer 51) due to the removal of first-stage photoresist layer 611 by the ashing process is then etched, and etching is continued to form source electrode 511 and drain electrode 512.

Further optionally, the operation of performing the ashing treatment on the first photoresist and the second photoresist can be performed after the operation of etching a region of the second metal layer and a region of the active layer that are outside the channel and uncovered by the first photoresist layer and the second photoresist layer.

As shown in FIG. 11, the implementation further provides a TFT array substrate; the TFT array substrate comprises rigid substrate 10, gate electrode 21 and gate scanning line 22 stacked on rigid substrate 10; and gate insulating layer 31, an active layer (comprising first active layer 41 and second active layer 42), source electrode 511, drain electrode 512, data line layer 52, passivation layer 71, pixel electrode 81 and common electrode 82 stacked sequentially on gate electrode 21 and gate scanning line 22. One side of drain electrode 512 is covered with pixel electrode 81; second gate insulating layer 32 and second active layer 42 are disposed between gate scanning line 22 and data line layer 52; gate scanning line 22 and data line layer 52 are respectively connected with common electrode 82.

It should be noted that those skilled in the art can make some changes and modifications to above implementations according to the disclosure and depiction of the foregoing description. Therefore, the present disclosure is not limited to the specific embodiments disclosed and described above, and some of equivalent modifications and changes made to the present disclosure should also be within the protection scope of the claim of the present disclosure.

What is claimed is:

1. A manufacturing method of a TFT array substrate comprises:
   providing a rigid substrate, depositing a first metal layer on the rigid substrate, and patterning the first metal layer to form a gate electrode and a gate scanning line;
   depositing sequentially a gate insulating layer, an active layer and a second metal layer on the gate and the gate scanning line;
   coating photoresist on the second metal layer and patterning the photoresist to form a first photoresist layer and a second photoresist layer; wherein the first photoresist layer comprises a first-stage photoresist layer, a second-stage photoresist layer and a third-stage photoresist layer; the thickness of the second-stage photoresist layer is larger than that of the first-stage photoresist layer, and the thickness of the third-stage photoresist layer is larger than that of the second-stage photoresist layer;
   the first-stage photoresist layer is disposed in the middle of the first photoresist layer and a channel is formed; and the thickness of the second photoresist layer is larger than that of the second-stage photoresist layer;
   etching a region of the second metal layer, a region of the active layer and a region of the gate insulating layer, which are outside the channel and uncovered by the first photoresist layer and the second photoresist layer to expose the rigid substrate;
   performing ashing treatment on the first photoresist layer and the second photoresist layer to remove the first-stage photoresist layer, and forming a source electrode, and a drain electrode by etching;
   performing ashing treatment on the second-stage photoresist layer, the third-stage photoresist layer and the second photoresist layer to remove the second-stage photoresist layer, and then depositing a passivation layer as a whole;
   stripping the third-stage photoresist layer and the second photoresist layer, and depositing a transparent conductive layer and patterning the transparent conductive layer to form a pixel electrode and a common electrode.

2. The manufacturing method as claimed in claim 1, wherein the active layer comprises a first amorphous silicon film and a second amorphous silicon film sequentially stacked on the gate insulating layer, and the first amorphous silicon film is disposed between the gate insulating layer and the second amorphous silicon film.

3. The manufacturing method as claimed in claim 2, wherein the material of the first amorphous silicon film comprises amorphous silicon and the material of the second amorphous silicon film comprises impurity ion-doped amorphous silicon.

4. The manufacturing method as claimed in claim 2, wherein the process of forming the source electrode and the drain electrode by etching comprises: etching the second metal layer after ashing the first-stage photoresist layer; the method further comprises etching the second amorphous silicon film to form source, drain, and conductive channel regions.

5. The manufacturing method as claimed in claim 1, wherein a data line layer is formed from the second metal layer covered by the second photoresist layer after etching the region of the second metal layer, the region of the active layer and the region of the gate insulating layer, which are outside the channel and uncovered by the first photoresist layer and the second photoresist layer.

6. The manufacturing method as claimed in claim 5, wherein the gate scanning line and the data line layer are bridged through the common electrode.

7. The manufacturing method as claimed in claim 1, wherein the material of the transparent conductive layer comprises at least one of indium tin oxide, indium oxide zinc, aluminum zinc oxide and indium gallium zinc oxide.

8. The manufacturing method as claimed in claim 1, wherein the material of the passivation layer comprises at least one of silicon oxide and silicon nitride.

9. The manufacturing method as claimed in claim 1, wherein the material of the first metal layer comprises at least one of copper, aluminum, neodymium, chromium, molybdenum, titanium and silver.

10. The manufacturing method as claimed in claim 1, wherein the material of the second metal layer comprises at least one of copper, aluminum, neodymium, chromium, molybdenum, titanium and silver.

11. A TFT array substrate prepared by the manufacturing method as claimed in claim 1.

12. The TFT array substrate as claimed in claim 11, wherein the active layer comprises a first amorphous silicon film and a second amorphous silicon film sequentially stacked on the gate insulating layer, and the first amorphous silicon film is disposed between the gate insulating layer and the second amorphous silicon film.

13. The TFT array substrate as claimed in claim 12, wherein the material of the first amorphous silicon film comprises amorphous silicon and the material of the second amorphous silicon film comprises impurity ion-doped amorphous silicon.

14. The TFT array substrate as claimed in claim 12, wherein the process of forming the source electrode and the drain electrode by etching comprises: etching the second metal layer after ashing the first-stage photoresist layer; the method further comprises etching the second amorphous silicon film to form source, drain, and conductive channel regions.

15. The TFT array substrate as claimed in claim 11, wherein a data line layer is formed from the second metal layer covered by the second photoresist layer after etching the region of the second metal layer, the region of the active layer and the region of the gate insulating layer, which are outside the channel and uncovered by the first photoresist layer and the second photoresist layer.

16. The TFT array substrate as claimed in claim 15, wherein the gate scanning line and the data line layer are bridged through the common electrode.

17. The TFT array substrate as claimed in claim 11, wherein the material of the transparent conductive layer comprises at least one of indium tin oxide, indium oxide zinc, aluminum zinc oxide and indium gallium zinc oxide.

18. The TFT array substrate as claimed in claim 11, wherein the material of the passivation layer comprises at least one of silicon oxide and silicon nitride.

19. A display panel, wherein the display panel comprises a TFT array substrate prepared by the manufacturing method as claimed in claim 1.

* * * * *